US005977829A

United States Patent [19]

Wells

[11] Patent Number: 5,977,829

[45] Date of Patent: Nov. 2, 1999

[54] LOW DISTORTION CURRENT FEEDBACK AMPLIFIER WITH DYNAMIC BIASING

[75] Inventor: Glenn E. Wells, Palm Bay, Fla.

[73] Assignee: Harris Corporation, Melbourne, Fla.

[21] Appl. No.: 08/972,887

[22] Filed: Nov. 18, 1997

[51] Int. Cl.[6] .......... H03F 3/26

[52] U.S. Cl. .......... 330/270; 330/267

[58] Field of Search .......... 330/265, 267, 330/268, 270, 271, 273

[56] References Cited

U.S. PATENT DOCUMENTS 4,454,479 6/1984 Spires .......... 330/265 X
4,471,322 9/1984 Yamaguchi et al. .......... 330/267

FOREIGN PATENT DOCUMENTS 119908 7/1984 Japan .......... 330/265
188208 10/1984 Japan .......... 330/265

*Primary Examiner*—Robert Pascal
*Assistant Examiner*—Patricia T. Nguyen
*Attorney, Agent, or Firm*—Rogers & Killeen

[57] ABSTRACT

A low distortion amplifier and method of reducing distortion in an amplifier at high output power in which energy dissipated while the amplifier is operating at low output power, is reduced. A bias circuit provides a quiescent bias current to the input stage of the amplifier for operating the amplifier without substantial distortion at low input signal levels and low output power. A sense transistor senses a current less than and proportional to an output current from the amplifier, and feeds back the sensed current to the input stage to augment the quiescent bias current when output power increases. When the output power decreases, the sensed current is removed in order to maintain the low power output bias currents.

13 Claims, 2 Drawing Sheets

LOW DISTORTION CURRENT FEEDBACK AMPLIFIER WITH DYNAMIC BIASING

BACKGROUND OF THE INVENTION

The present invention is directed to amplifiers, and more particularly to a low distortion amplifier and method of reducing distortion in the amplifier during high output power events.

Some amplifiers spend substantially more time operating at relatively low output power than at a higher output power. Nevertheless, the goal of the amplifier designed is to provide low total harmonic distortion regardless of the output power. Typically this goal is achieved by overdesigning the amplifier to accommodate the highest anticipated output power. Such overdesigned amplifiers are able to provide low distortion for low and high signal levels at low and high output power. However, the overdesign is manifested by the excess dissipation of power when the amplifier is providing signals at low output power. If the need for high output power is rare (e.g., some video amplifiers are called upon to provide high output power for about 1 μsec only one out of 10 million times), the waste of energy can be significant and is desirably avoided.

The present invention is directed to a low distortion amplifier and method of reducing distortion which avoids large power dissipation for low signal levels at low output power by dynamically adjusting the bias provided to an input stage of the amplifier based on a feedback from the output stage.

Accordingly, it is an object of the present invention to provide a novel method and amplifier which augments a quiescent (low output power) bias at high output power to thereby obviate the problems of the prior art.

It is a further object of the present invention to provide a novel method and amplifier which provides low distortion and low power dissipation at low signal levels, and low distortion and high power dissipation at high signal levels.

It is yet a further object of the present invention to provide a novel dynamically biased, low distortion, feedback amplifier in which total harmonic distortion is reduced by varying the bias currents of the analog amplifier.

It is another object of the present invention to provide a novel amplifier and method in which a current less than and proportional to an output current from the amplifier is sensed and provided to the input stage to augment the quiescent bias current at higher output power in order to operate the amplifier without substantial distortion at large input signal levels and high output power.

It is yet another object of the present invention to provide a novel amplifier with a bias circuit providing a quiescent bias current; an input stage with two pairs of input transistors, first and second level adjusting transistors each coupled to common bases of a different pair of input transistors, a first node coupled to a base of the first level adjusting transistor, and a second node coupled to a base of the second level adjusting transistor; a sensor for sensing a current less than and proportional to an output current from the amplifier; and first and second current mirrors each coupled to the sensor and to one of the first and second nodes, the first current mirror providing the sensed current to the input stage to augment the quiescent bias current at higher output power and the second current mirror thereafter removing the sensed current, thereby not affecting the quiescent bias which is used for low output power.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
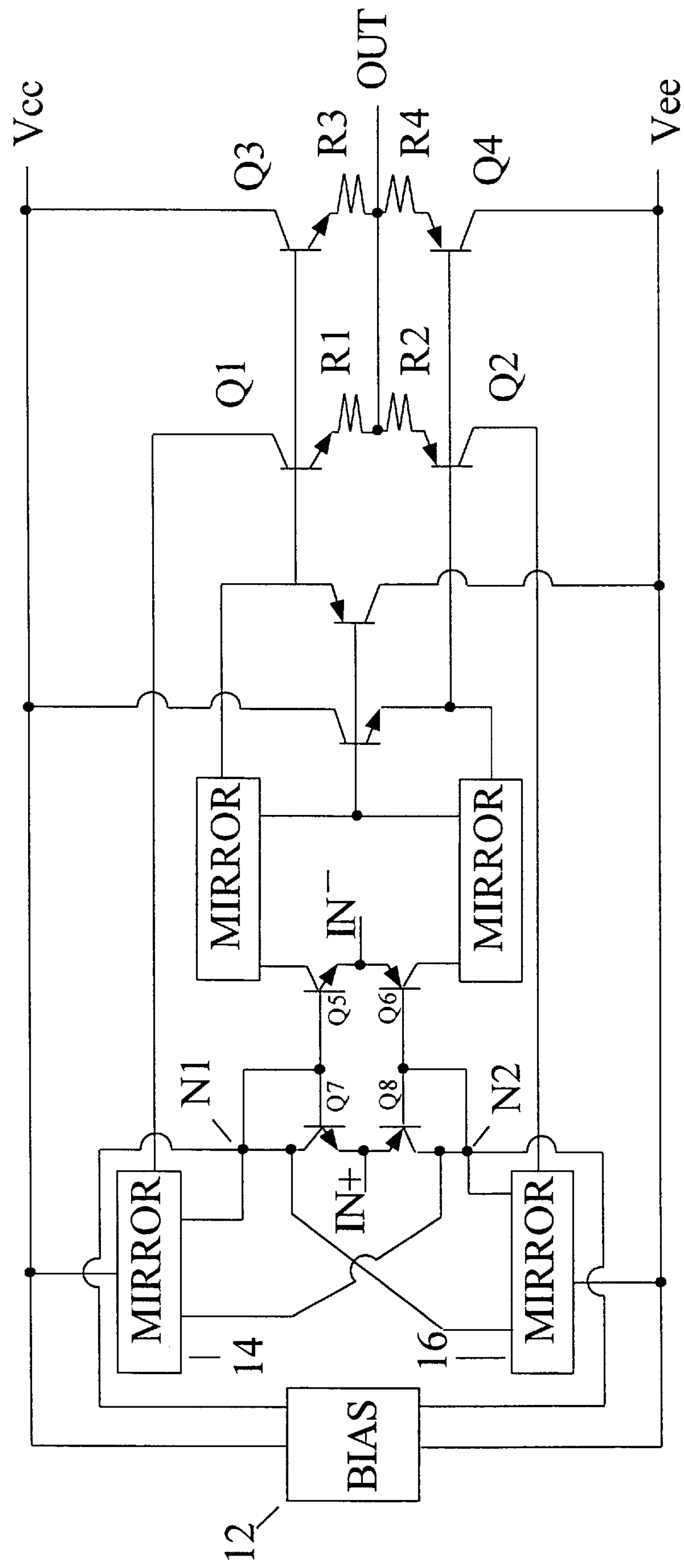
FIG. 1 is simplified circuit diagram of an embodiment of the present invention.

With reference now to FIG. 1, a conventional bias circuit 12 provides a quiescent bias current to enable low distortion operation of the amplifier shown in FIG. 1 at low output power. When higher output power is demanded, the demand is sensed by sense transistors Q1 and Q2 which operate current mirrors 14 and 16 to augment the bias current in the amplifier to enable low distortion operation at high output power. Note that bias circuit 12 provides the quiescent bias current to node N1 and that the current from current mirror 14 is also received at node N1 to augment the quiescent bias current.

The current sensed by sense transistors Q1 and Q2 is proportional to (and less than) the output current. An output current may be provided at node OUT which is between series-connected output transistors Q3 and Q4, each with an emitter degeneration resistor, R3 and R4 respectively. Sense transistors Q1 and Q2 may be connected in parallel with output transistor Q3 and Q4 and also have emitter degeneration resistors, R1 and R2 respectively, so that the current through the sense transistors is less than and proportional to the amplifier output current. The transistors Q3 and Q4 have larger emitter areas than the transistors Q1 and Q2.

The current through sense transistors Q1 and Q2 is coupled to the input stage through current mirrors 14 and 16. The input stage may include two pairs of input transistors, Q5 and Q7, and Q6 and Q8, each pair with a common base. The input stage needs an increased bias current to operate at high output power and low distortion. Accordingly, the sensed current which augments the quiescent bias current provided to node N1 from bias circuit 12 may be removed at node N2 (N1 and N2 reversed for negative going output).

By way of further explanation, the current sensed by the sense transistors is coupled to the input stage with current mirrors. The sensed current which is fed back to the input stage augments the input bias but should not interfere with other biasing currents. This is achieved herein by supplying and removing the fed back sensed current at the appropriate circuit nodes, which in this embodiment are the same nodes where the quiescent bias currents are delivered to the input stage. For a positive going output the sense current is mirrored twice. One portion is delivered to the collector of input transistor Q7 and the other portion is mirrored through current mirror 14 off the negative supply rail Vee and connected to the collector of input transistor Q8. When the output is negative going the same occurs the identical circuitry (mirrored through current mirror 16 off positive supply rail Vcc to the collector of input transistor Q7).

Figure 2:
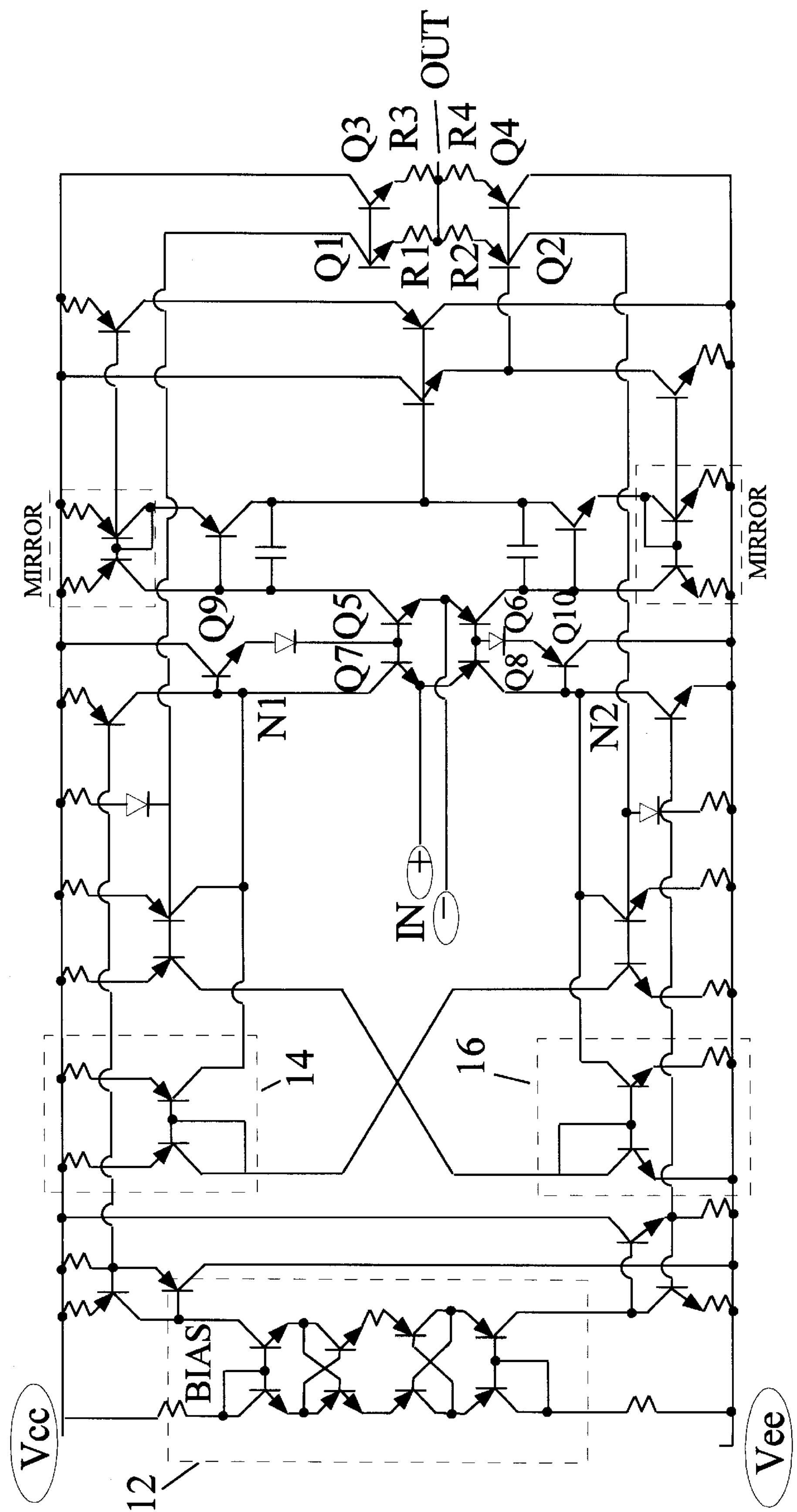
FIG. 2 is a circuit diagram of a further embodiment of the present invention.

With reference now to FIG. 2, a further embodiment of the present invention may include level adjusting transistors Q9 and Q10 and transistor wired diodes Q11 and Q12, coupled to the respective common bases of input transistors Q5–8. The bases of level adjusting transistors Q9 and Q10 may be coupled to nodes N1 and N2 respectively so that the sensed current which has been provided to these nodes controls operation of the level adjusting transistors which, in turn, control the signals to the bases of the input transistors.

The present invention provides various advantages, including the ability to provide a dynamically biased, low distortion, feedback amplifier in an integrated circuit which has low distortion and low power dissipation at low signal levels, and low distortion and high power dissipation at high signal levels. The invention finds application in various amplifiers, and is specifically of importance for linear analog amplifiers in which total harmonic distortion is to be reduced.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. An amplifier comprising:

a bias circuit for providing a quiescent bias current to an input stage of the amplifier and for operating the amplifier without substantial distortion at low input signal levels and low output power;

a sensor for sensing a current proportional to an output current from an output stage of the amplifier; and a current mirror coupled to said sensor and to the input stage for providing the current sensed by said sensor to the input stage to augment the quiescent bias current at higher output power, thereby enabling amplifier operation without substantial distortion at the high input signal levels and the higher output power.

2. The amplifier of claim 1 wherein the input stage comprises a first node coupled to (a) said bias circuit for receiving the quiescent bias current and (b) said current mirror for receiving the current sensed by said sensor.

3. An amplifier comprising:

a bias circuit for providing a quiescent bias current to an input stage of the amplifier and for operating the amplifier without substantial distortion at low input signal levels and low output power;

a sensor for sensing a current proportional to an output current from the amplifier;

a current mirror coupled to said sensor and to the input stage for providing the current sensed by said sensor to the input stage to augment the quiescent bias current at higher output power, thereby enabling amplifier operation without substantial distortion at the high input signal levels and the higher output power;

wherein said input stage of said amplifier comprises a first node coupled to (a) said bias circuit for receiving the quiescent bias current and (b) said current mirror for receiving the current sensed by said sensor; and wherein said input stage of said amplifier comprises two pairs of input stage transistors, and further comprises a level adjusting transistor for providing a control signal to bases of a first pair of said two pairs of input stage transistors, said first node being coupled to a base of said level adjusting transistor.

4. The amplifier of claim 3 further comprising a second current mirror coupled to said sensor and to a second node in the input stage for removing the current sensed by said sensor from an output from the input stage, and further comprising a second level adjusting transistor for providing a control signal to bases of a second pair of said two pairs of input stage transistors, said second node being coupled to a base of said second level adjusting transistor.

5. The amplifier of claim 1 further comprising a second current mirror coupled to said sensor and to the input stage for removing the current sensed by said sensor from an output from the input stage.

6. The amplifier of claim 5 wherein the input stage comprises a second node coupled to (a) said bias circuit for receiving the quiescent bias current and (b) said second mirror for removing the current sensed by said sensor.

7. The amplifier of claim 1 wherein said sensor comprises a sense transistor with a degeneration resistor coupled to an emitter thereof, and wherein said current mirror is coupled to a collector thereof.

8. The amplifier of claim 1 wherein the amplifier comprises a pair of series connected output transistors with emitter degeneration resistors coupled therebetween and the output current is provided from between said emitter degeneration resistors, and wherein said sensor comprises a pair of series connected sense transistors with further emitter degeneration resistors coupled therebetween, said sense transistors being connected in parallel with the output transistors.

9. The amplifier of claim 8 wherein each of the pair of series connected output transistors has a common base with a different one of said pair of series connected sense transistors.

10. A method of dynamically biasing a low distortion amplifier comprising the steps of:

providing a quiescent bias current to an input stage of the amplifier for operating the amplifier without substantial distortion at low input signal levels and low output power;

sensing a current less than and proportional to an output current from an output stage of the amplifier; and providing the sensed current to the input stage to augment the quiescent bias current at higher output power in order to operate the amplifier without substantial distortion at the higher input signal levels and the higher output power.

11. The method of claim 10 further comprising the step of removing the sensed current from the input stage so as not to affect the quiescent bias current to portions of the amplifier not requiring the augmented bias current.

12. An amplifier comprising:

a bias circuit for providing a quiescent bias current to an input stage of the amplifier and for operating the amplifier without substantial distortion at low input signal levels and low output power;

said input stage comprising, two pairs of input stage transistors, first and second level adjusting transistors each coupled to common bases of a different pair of said two pairs of input stage transistors, a first node coupled to a base of said first level adjusting transistor, and a second node coupled to a base of said second level adjusting transistor;

a sensor for sensing a current less than and proportional to an output current from the amplifier; and first and second current mirrors each coupled to said sensor and to a different one of said first and second nodes, said first current mirror for providing the current sensed by said sensor to said input stage to augment the quiescent bias current at higher output power thereby enabling amplifier operation without substantial distortion at higher input signal levels and the higher output power, and said second current mirror for removing the current sensed by said sensor from an output from said input stage.

13. The amplifier of claim 12 wherein the amplifier further comprises a pair of series connected output transistors with emitter degeneration resistors coupled therebetween and the output current is provided from between said emitter degeneration resistors, and wherein said sensor comprises a pair of series connected sense transistors with further emitter degeneration resistors coupled therebetween, said sense transistors being connected in parallel with the output transistors, and wherein each of the pair of series connected output transistors has a common base with a different one of said pair of series connected sense transistors.

* * * * *